United States Patent
Sidner et al.

(10) Patent No.: US 6,836,134 B2
(45) Date of Patent: Dec. 28, 2004

(54) APPARATUS AND METHOD FOR DETERMINING LEAKAGE CURRENT BETWEEN A FIRST SEMICONDUCTOR REGION AND A SECOND SEMICONDUCTOR REGION TO BE FORMED THEREIN

(75) Inventors: Diane W. Sidner, Noblesville, IN (US); John R. Fruth, Kokorno, IN (US); Dean M. Dahlgnist, Kokorno, IN (US)

(73) Assignee: Delphi Technologies, Inc., Troy, MI (US)

( * ) Notice: Subject to any disclaimer, the term of this patent is extended or adjusted under 35 U.S.C. 154(b) by 199 days.

(21) Appl. No.: 10/167,125

(22) Filed: Jun. 11, 2002

(65) Prior Publication Data

US 2003/0227293 A1 Dec. 11, 2003

(51) Int. Cl.[7] .......................... G01R 31/26; G01R 31/02
(52) U.S. Cl. ........................................ 324/765; 324/760
(58) Field of Search ................................. 324/760, 763, 324/765, 754, 158.1; 438/14–18; 257/48, 382–384

(56) References Cited

U.S. PATENT DOCUMENTS

| | | | | |
|---|---|---|---|---|
| 4,053,925 A | * | 10/1977 | Burr et al. .................. | 257/376 |
| 4,542,340 A | * | 9/1985 | Chakravarti et al. ....... | 324/769 |
| 4,936,928 A | * | 6/1990 | Shaw et al. ................. | 438/358 |
| 5,840,611 A | * | 11/1998 | Lee et al. ................... | 438/301 |
| 5,972,782 A | * | 10/1999 | Ostapenko .................. | 438/488 |
| 6,037,797 A | * | 3/2000 | Lagowski et al. .......... | 324/765 |
| 6,074,891 A | | 6/2000 | Staller | |
| 6,074,899 A | * | 6/2000 | Voldman ..................... | 438/155 |
| 6,249,138 B1 | * | 6/2001 | Huang et al. ............... | 324/765 |
| 6,271,539 B1 | * | 8/2001 | Nelson et al. ................ | 257/48 |
| 6,369,646 B1 | | 4/2002 | Kelser et al. | |
| 6,414,509 B1 | * | 7/2002 | Bhatt et al. ................. | 324/765 |
| 6,538,462 B1 | * | 3/2003 | Lagowski et al. .......... | 324/765 |
| 6,555,856 B1 | | 4/2003 | Staller | |
| 6,750,976 B2 | * | 6/2004 | Eriguchi ..................... | 356/630 |

* cited by examiner

*Primary Examiner*—David Zarneke
*Assistant Examiner*—Jermele M. Hollington
(74) *Attorney, Agent, or Firm*—Stefan V. Chmielewski (57) ABSTRACT

An apparatus and method for measuring leakage current between a first semiconductor region and a second semiconductor region to be formed therein includes a system for measuring surface minority carrier leakage within the first semiconductor region. A correlation is established between surface minority carrier lifetime in the first semiconductor region and leakage current between the first and second semiconductor regions, and in one embodiment a surface minority carrier lifetime threshold is designated based on this correlation. Leakage current between the first and second regions is acceptable if the measured surface minority carrier lifetime is greater than this threshold. In an alternate embodiment, a leakage current threshold is established, and the measured surface minority carrier leakage is converted via the correlation to a measured leakage current. Leakage current between the first and second regions is acceptable in this embodiment if the measured leakage current is less than the leakage current threshold.

16 Claims, 6 Drawing Sheets

APPARATUS AND METHOD FOR DETERMINING LEAKAGE CURRENT BETWEEN A FIRST SEMICONDUCTOR REGION AND A SECOND SEMICONDUCTOR REGION TO BE FORMED THEREIN

TECHNICAL FIELD

The present invention relates generally to techniques for measuring leakage current between two adjacent semiconductor layers of an integrated circuit, and more specifically to techniques for determining leakage current between a first semiconductor layer and a second semiconductor layer to be subsequently formed therein as a function of measured minority carrier lifetimes in the first semiconductor layer.

BACKGROUND OF THE INVENTION

Semiconductor devices, particularly power devices, are often fabricated to operate as switches. As a switch, such a semiconductor device should pass current when turned "on" and should block current when turned "off." In the "off" state, however, some low level of leakage current is unavoidable, although many applications require such leakage current to be maintained below very low leakage current thresholds under a wide variety of operating conditions.

Leakage current in semiconductor devices is a function, at least in part, of the cleanliness of the semiconductor materials used, and may accordingly be affected by semiconductor bulk and interface defects, material contamination, and the like. Typically, wafers are processed through the entire fabrication cycle before the cleanliness level of the wafer is ascertained. This practice results in a potentially large amount of value being added to "dirty" wafers which will be scrapped after reaching final wafer test. This practice also creates uncertainty about the inventory of wafers being processed, as the fabrication line could have several weeks of bad material in process before a leakage current problem is discovered.

The present invention is directed to an apparatus and method for determining leakage current between a first semiconductor region and a second semiconductor region to be subsequently formed within the first semiconductor region. One application of such an apparatus and method is in a semiconductor wafer fabrication process to determine leakage between an epitaxial region or the like and other semiconductor regions to be subsequently diffused or implanted therein, so that dirty wafers may be scrapped before investing further fabrication costs. Other applications will occur to those skilled in the art, and any such other applications are intended to fall within the scope of the present invention.

SUMMARY OF THE INVENTION

In accordance with one aspect of the present invention, a method of determining leakage current between a first semiconductor region and a second semiconductor region to be subsequently formed therein comprises the steps of correlating surface minority carrier lifetime in the first semiconductor region to leakage current between the first and second semiconductor regions, based on the correlation between surface minority carrier lifetime and leakage current, establishing a surface minority carrier lifetime threshold, measuring surface minority carrier lifetime in the first semiconductor region, and determining that the leakage current between the first and second semiconductor regions is acceptable if the measured surface minority carrier lifetime is greater than the surface minority carrier lifetime threshold.

In accordance with another aspect of the present invention, a method of determining leakage current between a first semiconductor region and a second semiconductor region to be subsequently formed therein comprises the steps of establishing a leakage current threshold, correlating surface minority carrier lifetime in the first semiconductor region to leakage current between the first and second semiconductor regions, measuring surface minority carrier lifetime in the first semiconductor region, based on the correlation between surface minority carrier lifetime and leakage current, converting the measured surface minority carrier lifetime to a measured leakage current; and determining that the leakage current between the first and second semiconductor regions is acceptable if the measured leakage current is less than the leakage current threshold.

In accordance with a further aspect of the present invention, an apparatus for determining leakage current between a first semiconductor region and a second semiconductor region to be subsequently formed therein comprises a memory having stored therein a surface minority carrier lifetime threshold based on a correlation between surface minority carrier lifetime in the first semiconductor region and leakage current between the first and second semiconductor regions, a probe configured to interface with the first semiconductor region and produce one or more signals relating to surface minority carrier lifetime therein, and a computer responsive to the one or more signals to determine a measured surface minority carrier lifetime in the first semiconductor region, the computer determining that the leakage current between the first and second semiconductor regions is acceptable if the measured surface minority carrier lifetime is greater than the surface minority carrier lifetime threshold and otherwise determining that the leakage current is unacceptable.

In accordance with a further aspect of the present invention, an apparatus for determining leakage current between a first semiconductor region and a second semiconductor region to be subsequently formed therein comprises a memory having stored therein a leakage current threshold and a correlation between surface minority carrier lifetime in the first semiconductor region and leakage current between the first and second semiconductor regions, a probe configured to interface with the first semiconductor region and produce one or more signals relating to surface minority carrier lifetime therein and a computer responsive to the one or more signals to determine a measured surface minority carrier lifetime in the first semiconductor region and to convert the measured surface minority carrier lifetime to a measured leakage current based on the correlation therebetween, the computer determining that the leakage current between the first and second semiconductor regions is acceptable if the measured leakage current is less than the leakage current threshold and otherwise determining that the leakage current is unacceptable.

One object of the present invention is to determine leakage current between a first semiconductor region and a second semiconductor region to be subsequently formed within the first semiconductor region.

Another object of the present invention is to determine whether the leakage current between the two semiconductor regions is below an acceptable leakage current threshold.

A further object of the present invention is to determine leakage current between a first semiconductor region and a second semiconductor region to be subsequently formed within the first semiconductor region based on a measurement of surface minority carrier lifetime within the first semiconductor region.

These and other objects of the present invention will become more apparent from the following description of the preferred embodiment.

DESCRIPTION OF THE ILLUSTRATIVE EMBODIMENTS

Figure 1:
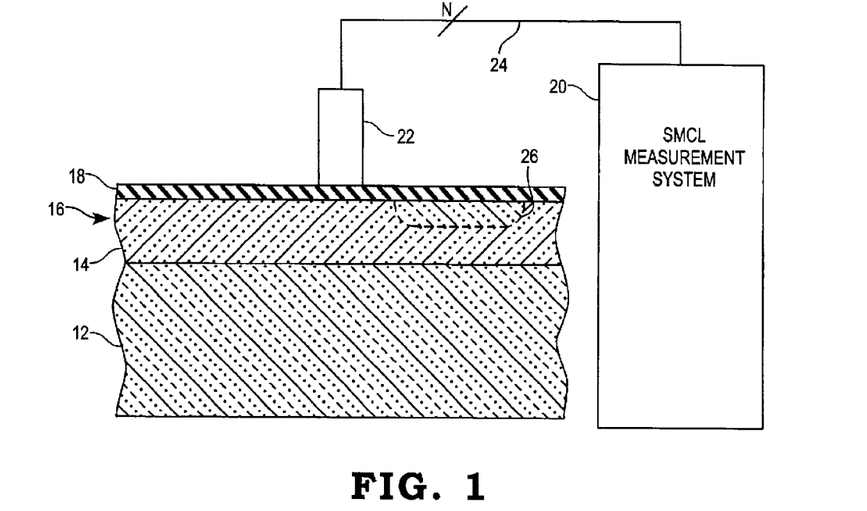
FIG. 1 is a partial cross-sectional view of an apparatus for measuring leakage current between a first semiconductor region and a second semiconductor region to be subsequently formed therein.

Referring now to FIG. 1, a partial cross-sectional view of one illustrative apparatus 10 for determining leakage current between a first semiconductor region or layer 14 and a second semiconductor region 26 to be subsequently formed within the first semiconductor region 14 is shown. In the illustrated embodiment, semiconductor region 14 is an epitaxial semiconductor layer, either N-type or P-type, grown or otherwise formed on a semiconductor substrate 12 which will typically be formed of an opposite semiconductor material than that used to form epitaxial layer 14; e.g., either P-type or N-type, respectively, wherein layers 12 and 14 generally form part of a semiconductor wafer 16. In one embodiment, for example, the semiconductor layer 12 is formed by appropriately doping a substantially intrinsic semiconductor wafer (e.g., an undoped silicon wafer), wherein layers 12 and 14 form a semiconductor junction therebetween. In some cases, a buried layer of appropriately doped semiconductor material may be disposed between layers 12 and 14 as is known in the art. In any case, a layer of oxide 18 (e.g., $SiO_2$) is typically formed on top of layer 14.

After formation of semiconductor region or layer 14, a number of additional semiconductor regions, e.g., semiconductor region 26, are typically formed within region or layer 14 by known techniques. For example, in cases where semiconductor region or layer 14 is an N-type epitaxial layer, semiconductor region 26 may be a P-type well that will form a portion of one or more electrical devices. Alternatively, in cases where semiconductor region or layer 14 is a P-type epitaxial layer, semiconductor region 26 may be an N-type well that will form a portion of one or more electrical devices. In either case, semiconductor region 26 is formed within region or layer 14 via known diffusion, implantation or other known techniques, to form a semiconductor junction therebetween. Those skilled in the art will recognize that while the semiconductor wafer 16 illustrated in FIG. 1 includes an epitaxial layer 14, in which another semiconductor region 26 will be subsequently formed, grown or otherwise formed on a semiconductor substrate 12, the concepts of the present invention apply directly to cases where epitaxial region 14 is omitted and region 26 is formed directly into layer 12.

Apparatus 10 includes a surface minority carrier lifetime (SMCL) measurement system 20 electrically connected to a probe apparatus 22 via a number, N, of signal paths wherein N may be any positive integer. System 20 is operable to interface with semiconductor layer 14 via probe 22 in a contacting or non-contacting manner, and to measure the surface minority carrier lifetime within layer 14 in accordance with known techniques. Generally, system 20 may be any known system operable to measure or otherwise determine the surface minority carrier lifetime in semiconductor layer 14, and one illustrative embodiment of such a system 20 will be described in detail hereinafter with respect to FIGS. 4–8.

Figure 2:
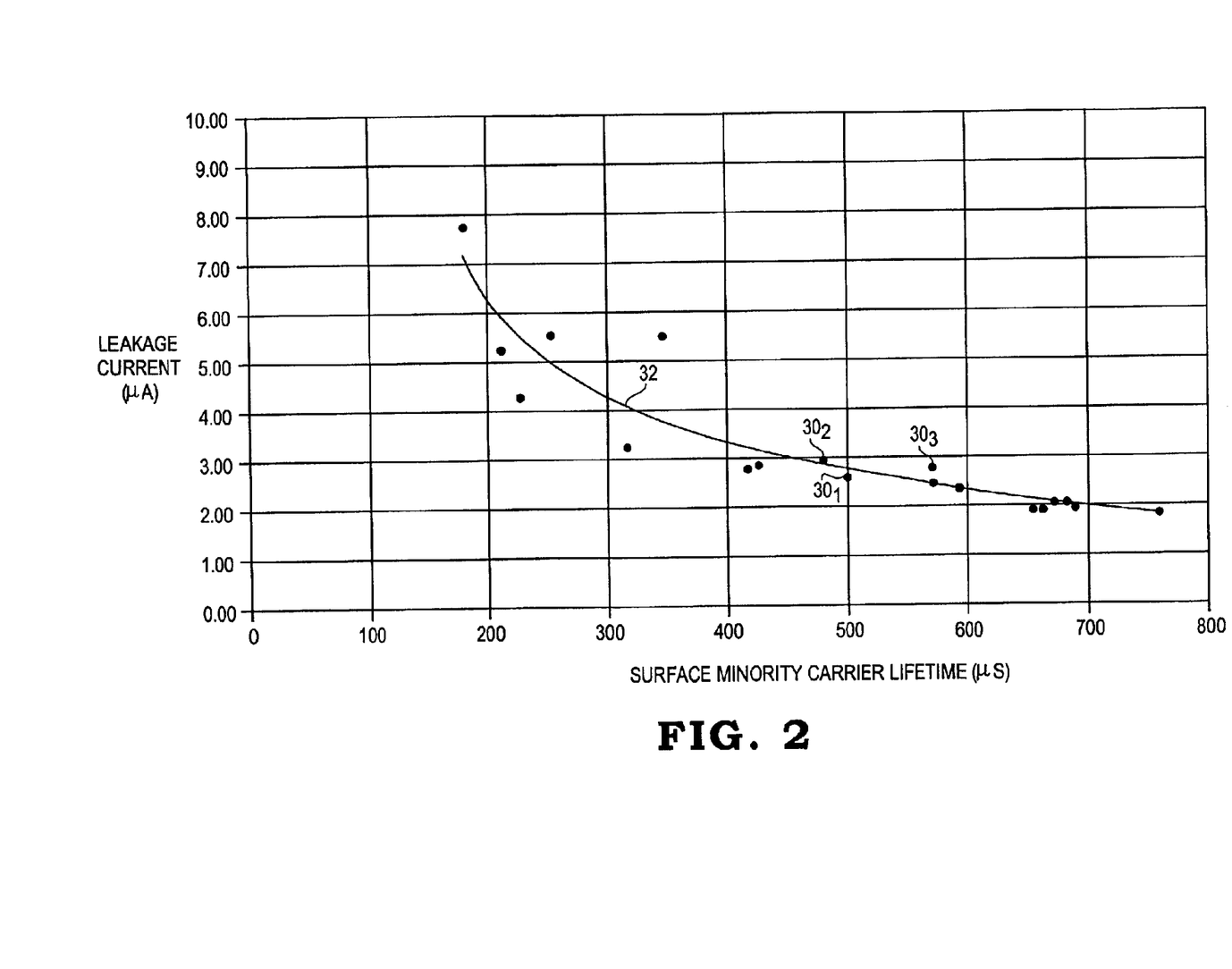
FIG. 2 is a plot of surface minority carrier lifetime vs. leakage current correlating surface minority carrier lifetime in a first semiconductor region to leakage current between the first semiconductor region and a second semiconductor region to be subsequently formed therein.

It has been determined through experimentation that a correlation exists between minority carrier lifetimes within the first several microns (e.g., 5) of the surface of semiconductor region or layer 14 and leakage currents that will exist between semiconductor region or layer 14 and semiconductor regions 26 that will be subsequently formed within region or layer 14. Referring to FIG. 2, a number of surface minority carrier lifetime vs. leakage current points $30_1$, $30_2$, $30_3$ ... are plotted for one known semiconductor fabrication process wherein semiconductor layer 12 is a P-type substrate, semiconductor region or layer 14 is an N-type epitaxial layer and the semiconductor regions 26 to be subsequently formed within region 14 are a P-type semiconductor material. Using a regression-type analysis, the various data points $30_1$, $30_2$, $30_3$ ... were fit to a curve 32 correlating surface minority carrier lifetime in semiconductor region or layer 14 to leakage current between semiconductor region or layer 14 and any semiconductor regions 26 to be subsequently formed within region or layer 14. The data points $30_1$, $30_2$, $30_3$ ... illustrated in FIG. 2 were generated through independent measurements of surface minority carrier lifetimes in region or layer 14 prior to any further wafer processing steps and leakage currents between region or layer 14 and a number of semiconductor regions 26 after fabrication of a number of wafers 16 was completed. These data points $30_1$, $30_2$, $30_3$ ... were then subsequently correlated using known data regression techniques to form curve 32. In the illustrated embodiment, curve 32 is defined by regression parameters $y=916.72 \times 10^{-0.938}$ and $R^2=0.8799$. Those skilled in the art will recognize that the location of data points $30_1, 30_2, 30_3 \ldots$, and therefore the parameters of curve 32, will depend, at least in part, on the type and doping concentration of semiconductor regions 14 and 26, the cleanliness (e.g., number of trapping sites, etc.) of semiconductor layer 14, as well as other factors.

Figure 3A:
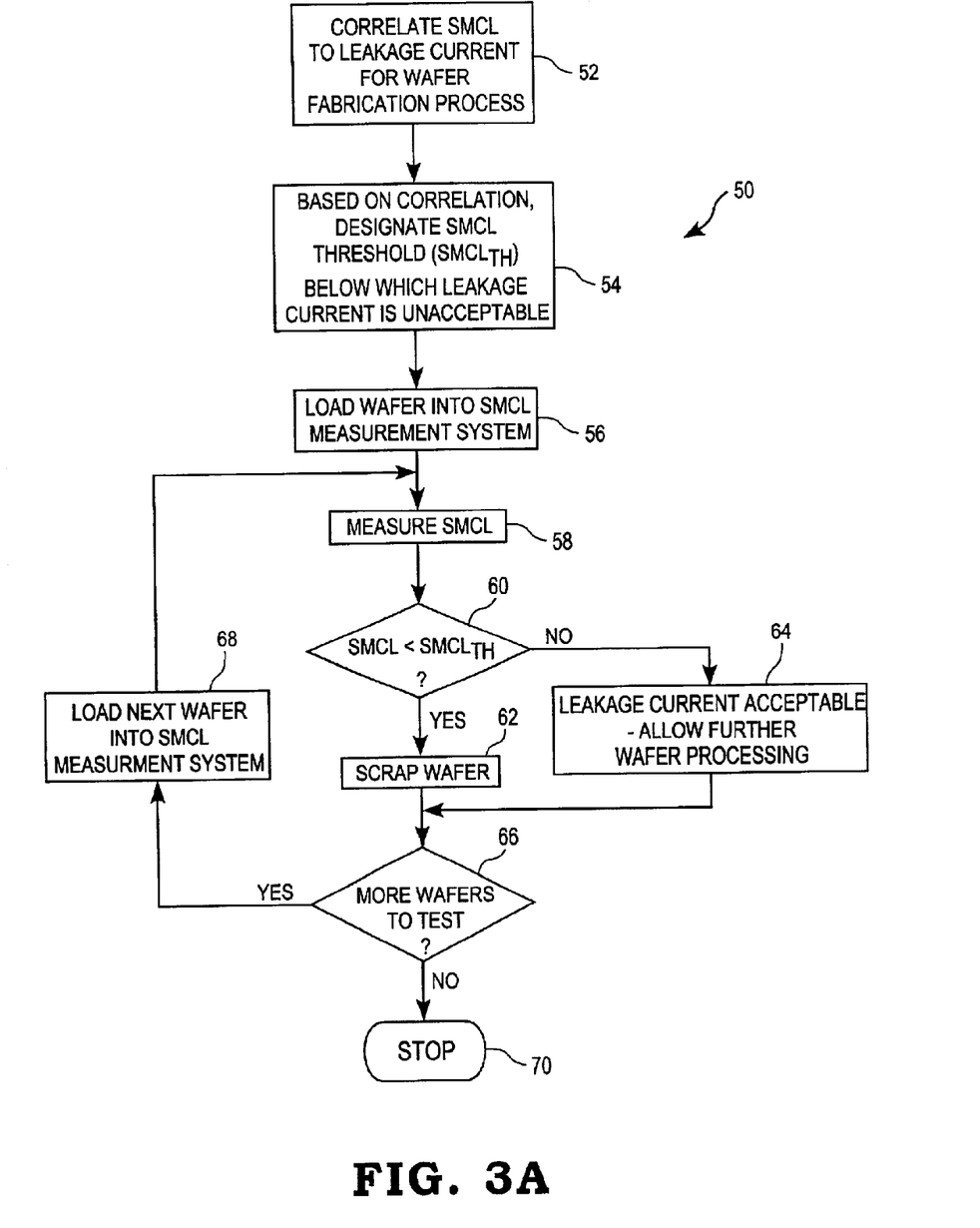
FIG. 3A is a flowchart illustrating one embodiment of a process for determining leakage current between the first and second semiconductor regions using the apparatus of FIG. 1.

Referring now to FIG. 3A, a flowchart is shown illustrating one embodiment of a process 50 for determining leakage current between semiconductor region or layer 14 and semiconductor regions 26 to be subsequently formed within region or layer 14 using the apparatus 10 of FIG. 1. Process 50 may be carried out manually, although it is contemplated that at least some of the steps of process 50 may alternatively be executed by a computer comprising part of the minority carrier lifetime measurement system 20. In such embodiments, process 50 may be provided, in whole or in part, in the form of a software algorithm executable by such a computer comprising part of system 20. In any case, process 50 begins at step 52 where a correlation is established between surface minority carrier lifetimes within semiconductor region or layer 14 and leakage currents between region or layer 14 and semiconductor regions 26 to be subsequently formed within region or layer 14, for a specified semiconductor fabrication process. Such a correlation may take the form of one or more equations, graphical representations, or the like, relating surface minority carrier lifetimes to leakage currents, and one example of such a correlation in the form of a curve 32 is illustrated and described hereinabove with respect to FIG. 2.

Thereafter at step 54, a surface minority lifetime carrier threshold value, $SMCL_{TH}$, is designated based on the correlation established at step 52, wherein $SMCL_{TH}$ corresponds to a specified leakage current threshold above which leakage current between semiconductor region or layer 14 and subsequently formed semiconductor regions 26 is unacceptable. For example, in the semiconductor wafer fabrication process illustrated in FIG. 2, a maximum acceptable leakage current may be 2.5 micro amperes. Using the correlation 32 curve illustrated in FIG. 2, $SMCL_{TH}$ thus corresponds to approximately 550 microseconds, and all surface minority carrier lifetimes below this value correspond to unacceptable leakage currents. In embodiments of system 10 wherein process 50 is executed by a computer included within SMCL measurement system 20, $SMCL_{TH}$ may be stored within a memory included within the SMCL measurement system computer.

Following step 54, process 50 advances to step 56 where wafer 16 (possibly one in a series of such wafers) is loaded into the surface minority carrier lifetime measurement system 20. Thereafter at step 58, the surface minority carrier lifetime measurement system 20 is activated to measure the surface minority carrier lifetime within layer 14 of wafer 16.

Figure 4:
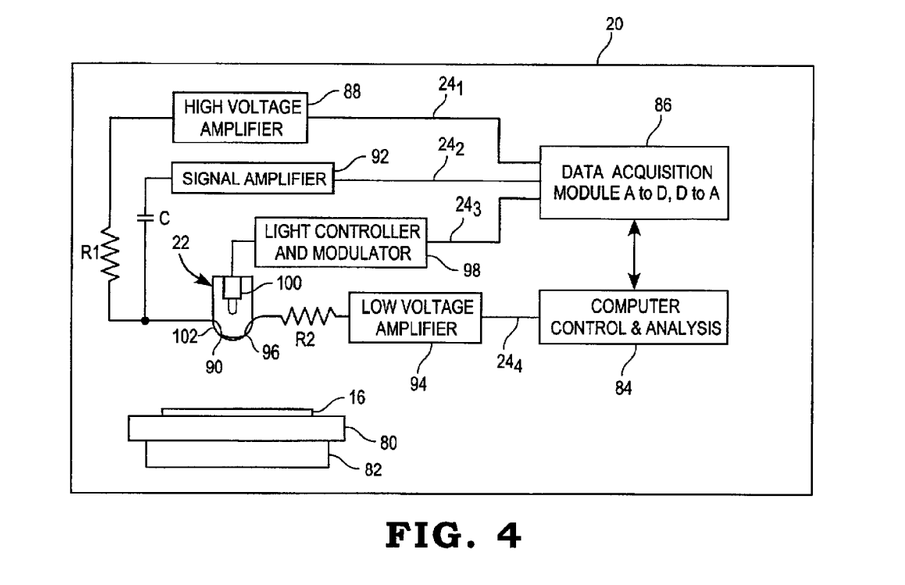
FIG. 4 is a diagrammatic illustration of one embodiment of the surface minority carrier lifetime measurement system of FIG. 1.

As described hereinabove, it is contemplated that any known system or technique for determining surface minority carrier lifetime may be used to carry out step 58. Referring to FIG. 4, a block diagram is shown illustrating details of one known embodiment of such a surface minority carrier lifetime measurement system 20 that may be used at step 58. Details relating to the structure and operation of system 20 will now be described before returning to the description of process 50.

The embodiment of the surface minority carrier lifetime measurement system 20 illustrated in FIG. 4 includes a wafer chuck 80 configured to carry wafer 16, wherein the combination of chuck 80 and wafer 16 is positionable via wafer positioner 82. A microprocessor-based computer 84, including a memory, is electrically connected to a data acquisition module including analog-to-digital (A/D) and digital-to-analog (D/A) inputs and outputs. Module 86 is electrically connected to a high voltage amplifier 88 via signal path $24_1$, to a signal amplifier 92 via signal path $24_2$ and to a light controller and modulator 98 via signal path $24_3$. Computer 84 is electrically connected to a low voltage amplifier 94 via signal path $24_4$. A probe assembly 22 includes a first electrical probe 90 electrically connected to one end of a first resistor, R1, having an opposite end electrically connected to amplifier 88. Probe 90 is also electrically connected to one end of a capacitor, C, having an opposite end electrically connected to amplifier 92. A second electrical probe 96 included within probe assembly 22 is electrically connected to end of a second resistor, R2, having an opposite end electrically connected to amplifier 94. Probe assembly 22 further includes an LED light source 100 electrically connected to light controller and modulator 98.

Figure 5:
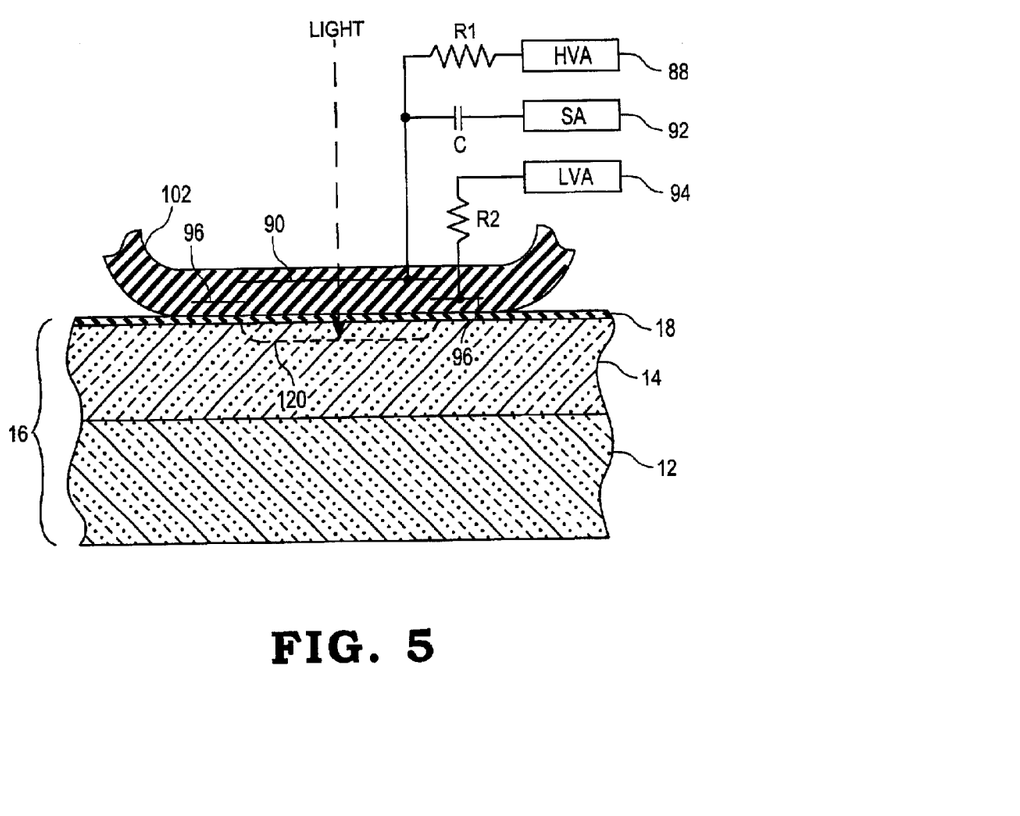
FIG. 5 is a diagrammatic illustration of one embodiment of the probe assembly of the surface minority carrier lifetime measurement system of FIG. 4 shown interfacing with a portion of a partially processed semiconductor wafer.
Figure 6:
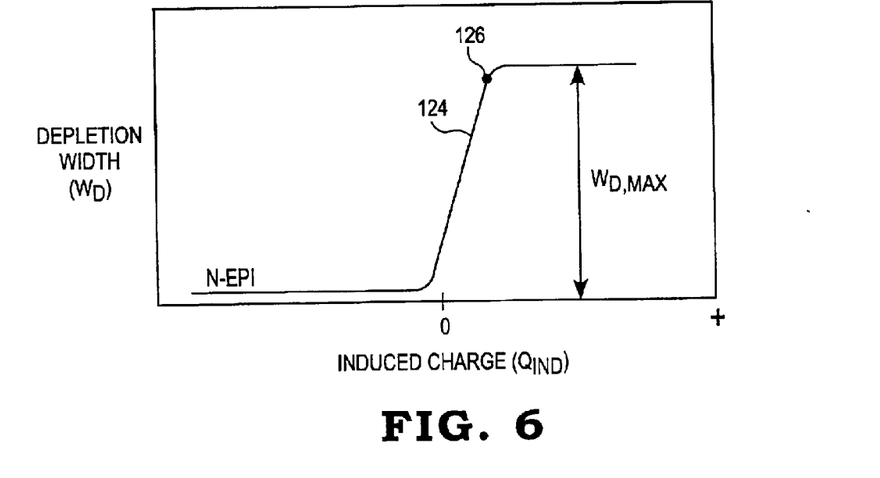
FIG. 6 is a plot of depletion region width vs. charge induced on the top layer of the wafer illustrated in FIG. 5.

Referring now to FIG. 5, a magnified and cross-sectional view of the interface between probe assembly 22 and wafer 16 is shown. Electrical probes 90 and 96 are carried by a Mylar insulator 102 disposed in contact with the oxide layer 18 of wafer 16. The electrical probes 90 and 96, in this embodiment, accordingly do not contact the semiconductor layer 14 directly, but are instead capacitively coupled to semiconductor layer 14 through insulator 102 and oxide layer 18. Probe 90 is an annular, transparent center dot probe, and probe 96 is an opaque, concentric ring that surrounds probe 90. This configuration allows light from LED light source 100 to illuminate a portion of the surface of oxide layer 18 defined by probe 90. Computer 84 is operable to control the high voltage amplifier 88 and low voltage amplifier 94 to induce a charge under probe 90 sufficient to create a depletion region 120. Generally, the polarities of the voltages applied to probes 90 and 94 are selected to create and confine the depletion region directly under probe 90. For example, in the case where semiconductor layer 14 is an N-type epitaxial layer, the voltage applied to probe 90 is a negative voltage sufficient to repel majority electron carriers from the N-type layer 14 and create a depletion region 120 devoid of majority carriers directly beneath probe 90. The voltage applied to probe 96 is a small positive voltage sufficient to maintain the area of layer 14 under probe 96 in accumulation, thereby confining the depletion region 120 to an area directly under probe 90. The polarities of the voltages applied to probes 90 and 96 are reversed in the case where layer 14 is a P-type semiconductor material.

The width, $W_D$, of the depletion region 120 increases with increasing negative voltage applied to probe 90 (e.g., increasing charge, $Q_{IND}$, induced on the surface of semiconductor layer 14), as illustrated by the $W_D$ VS. $Q_{IND}$ curve 124 of FIG. 6. A maximum depletion region width $W_{D,MAX}$ occurs at a sufficiently high induced charge corresponding to the onset of inversion 126. No appreciable increase in depletion region width, $W_D$, will thereafter result from additional induced charge, $Q_{IND}$.

Figure 7A:
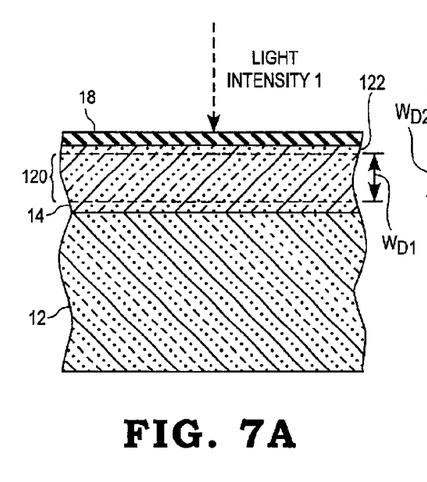
FIG. 7A is a diagrammatic illustration of depletion region width in the top layer of the semiconductor wafer of FIG. 5 during inversion under a first level of light intensity.

With sufficient charge induced on the surface of semiconductor layer 14 to hold the surface of the depletion region 120 at inversion, the light source 100 is activated as illustrated in FIG. 7A. The incident beam, having a photon energy greater than the semiconductor bandgap, generates a potential that creates electron-hole pairs, or minority carriers, at the surface of region or layer 14. The creation of these minority carriers affects the depletion region 120, decreasing it from $W_{D,MAX}$ to $W_{D1}$ as illustrated in FIG. 7A.

Figure 7B:
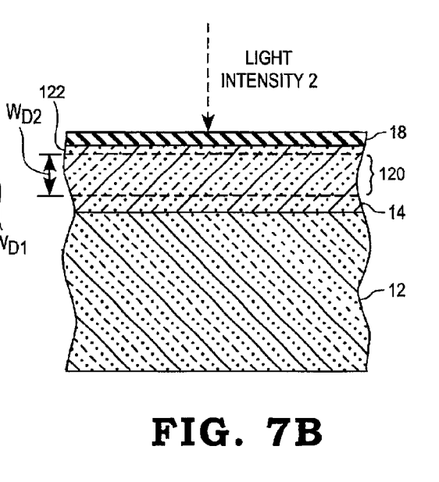
FIG. 7B is a diagrammatic illustration of depletion region width in the top layer of the semiconductor wafer of FIG. 5 during inversion under a second greater level of light intensity.

As the light intensity is increased from light intensity 1, as illustrated in FIG. 7A, to light intensity 2, as illustrated in FIG. 7B, more minority carriers are created, thereby further decreasing the width of the depletion region 120 from $W_{D1}$ to $W_{D2}$. The recombination rate of these generated minority carriers is a function of the available recombination sites, which is a function of the cleanliness of the semiconductor region or layer 14.

Figure 8:
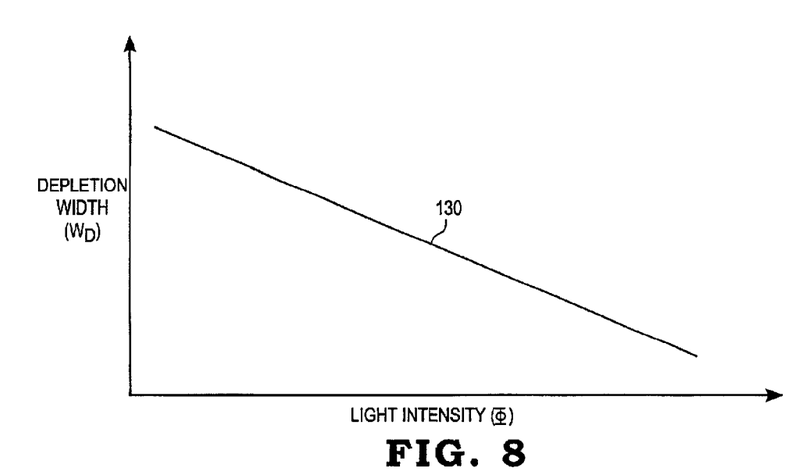
FIG. 8 is a plot of depletion region width vs. light intensity resulting from modulation of light intensity as illustrated in FIGS. 7A and 7B.

There exists a linear relationship 130 between the width, $W_D$, of the depletion region 120 and the intensity of light, produced by light source 100 when the surface of the depletion region 120 is held at inversion, as shown in FIG. 8, wherein the slope of this relationship 130 is proportional to the minority carrier lifetime, Ts, at the surface of the semiconductor region or layer 14. Changes in surface potential resulting from modulation of light source 100 are detected by probe 90, which is capacitively coupled to the signal amplifier 92 as shown in FIG. 5. The computer 84 of the surface minority carrier lifetime measurement system 20 is operable to control measurement of the surface minority carrier lifetime in semiconductor layer 14 by controlling amplifiers 88 and 94 in a manner that maintains the surface of the depletion region 120 at inversion, controlling the light controller and modulator 98 to sweep the intensity of light produced by light source 100 between two selectable light intensities, measuring via probe 90 the resulting change in surface potential of semiconductor layer 14, and computing therefrom the surface minority carrier lifetime in the semiconductor region or layer 14 using known equations. Typically, system 20 is operable to measure surface minority carrier lifetimes a number of times at a number of different locations, and an average surface minority carrier lifetime, representative of the surface minority carrier lifetime of the wafer 16, is computed therefrom.

The example embodiment of the surface minority carrier lifetime measurement system 20 illustrated and described with respect to FIGS. 4–8 is a SCA-2500 Surface Charge Analyzer, commercially available through Semitest, Inc. of Billerica, Mass. Further details relating to the structure and operation of the above-described embodiment of the surface minority carrier lifetime measurement tool 20 are set forth in the SCA-2500/SMIF Surface Charge Analyzer User Manual, rev. date January 1998, the contents of which are incorporated herein by reference. It is to be understood, however, that details of such a system 20 are provided only to illustrate one example of a surface minority lifetime carrier measurement system suitable for use with the present invention, and that other known surface minority carrier lifetime measurement systems and/or other known surface minority carrier lifetime techniques are contemplated.

Referring once again to FIG. 3A, process 50 advances from step 58 to step 60 where a comparison is made between the measured surface minority carrier lifetime (SMCL) resulting from step 58 and the surface minority carrier lifetime threshold value, $SMCL_{TH}$ designated at step 54. If, at step 60, SMCL is less than $SMCL_{TH}$, this indicates that the corresponding leakage current between semiconductor region or layer 14 and one or more semiconductor regions 26 to be subsequently formed therein is greater than a minimum acceptable leakage current value, and process 50 accordingly advances to step 62 where the wafer 16 is scrapped or designated for scrapping. If, on the other hand, SMCL is greater than or equal to $SMCL_{TH}$ at step 60, this indicates that the corresponding leakage current between semiconductor region or layer 14 and one or more semiconductor regions 26 to be subsequently formed therein is at or below the minimum acceptable leakage current value, and process 50 accordingly advances to step 64 where wafer 16 is designated as exhibiting acceptable leakage current, and is allowed to continue or advance to further wafer processing steps. Process 50 advances from either of steps 62 or 64 to step 66 where an inquiry is made as to whether any additional wafers are available for testing. If so, process 50 advances to step 68 where the next wafer is loaded into the surface minority carrier lifetime measurement system 20 before again executing steps 58–64. If, on the other hand, step 68 reveals no additional wafers available for testing, process 50 advances to step 70 where process 50 stops.

Figure 3B:
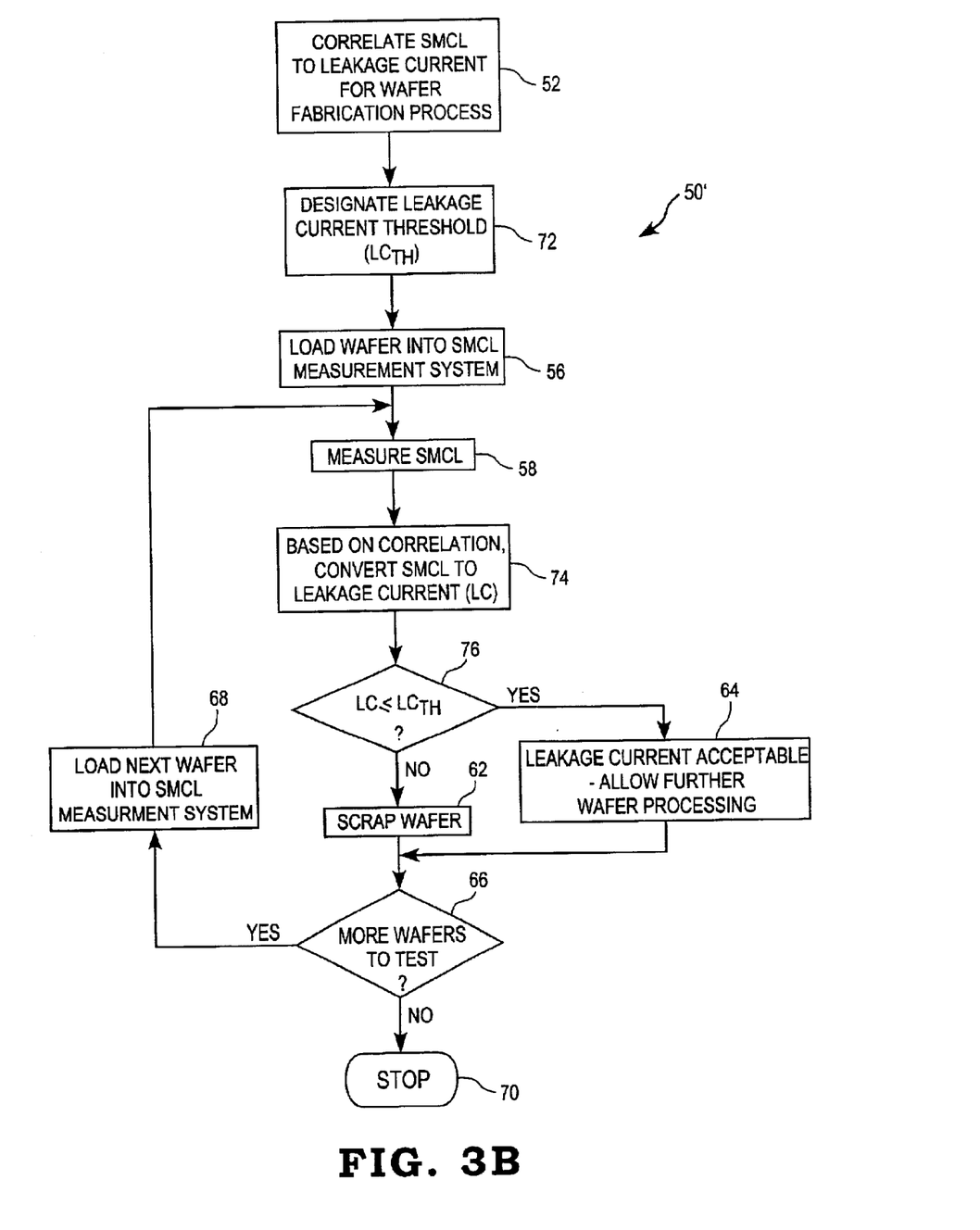
FIG. 3B is a flowchart illustrating an alternate embodiment of a process for determining leakage current between the first and second semiconductor regions using the apparatus of FIG. 1.

Referring now to FIG. 3B, a flowchart is shown illustrating an alternate embodiment of a process 50' for determining leakage current between region or layer 14 and one or more semiconductor regions 26 to be subsequently formed therein using the apparatus 10 of FIG. 1. As with process 50, process 50' may be carried out manually, although it is contemplated that at least some of the steps of process 50' may alternatively be executed by a computer comprising part of the minority carrier lifetime measurement system 20. In such embodiments, process 50' may be provided, in whole or in part, in the form of a software algorithm executable by such a computer comprising part of system 20. In any case, process 50' shares some steps in common with process 50 illustrated in FIG. 3A, and like numbers are therefore used to identify like steps.

Process 50' begins at step 52 where a correlation is established between surface minority carrier lifetimes within semiconductor layer 14 and leakage currents between semiconductor region or layer 14 and one or more semiconductor regions 26 to be subsequently formed therein, for a specified semiconductor fabrication process. Step 52 may be carried out as described hereinabove with respect to process 50. In embodiments wherein the computer of system 20 is operable to execute process 50', the correlation of step 52 is stored in memory. Thereafter at step 72, a leakage current threshold, $LC_{TH}$, is designated, wherein $LC_{TH}$ will typically correspond to a maximum acceptable leakage current. Using the example illustrated by the correlation 32 of FIG. 2, $LC_{TH}$ may be set at 2.5 micro amperes. Following step 72, process 50' advances to step 56 where the wafer 16 is loaded into the surface minority carrier lifetime measurement system 20. Thereafter at step 58, system 20 is operable to measure the surface minority carrier lifetime of semiconductor region or layer 14 as described hereinabove. Following step 58, process 50' advances to step 74 where the measured surface minority carrier lifetime resulting from execution of step 58 is converted to a measured leakage current (LC) value using the correlation established at step 52. In embodiments wherein the computer of system 20 is operable to execute process 50', the computer of system 20 is operable to execute step 74 by mapping the measured surface minority carrier lifetime to a corresponding leakage current value, LC, using the correlation stored in memory at step 52.

In any case, process 50' advances from step 74 to step 76 where the measured leakage current value, LC, is compared with the designated leakage current threshold, $LC_{TH}$. If, at step 74, LC is greater than $LC_{TH}$, this indicates that the corresponding leakage current between semiconductor region or layer 14 and one or more semiconductor regions 26 to be subsequently formed therein is greater than a minimum acceptable leakage current value, and process 50' accordingly advances to step 62 where the wafer 16 is scrapped or designated for scrapping. If, on the other hand, LC is less than or equal to $LC_{TH}$ at step 76, this indicates that the corresponding leakage current between semiconductor region or layer 14 and one or more semiconductor regions 26 to be subsequently formed therein is at or below the minimum acceptable leakage current value, and process 50' accordingly advances to step 64 where wafer 16 is designated as exhibiting acceptable leakage current, and is allowed to continue or advance to further wafer processing steps. Process 50' advances from either of steps 62 or 64 to step 66 where an inquiry is made as to whether any additional wafers are available for testing. If so, process 50' advances to step 68 where the next wafer is loaded into the surface minority carrier lifetime measurement system 20 before again executing steps 58–64. If, on the other hand, step 68 reveals no additional wafers available for testing, process 50 advances to step 70 where process 50' stops.

While the invention has been illustrated and described in detail in the foregoing drawings and description, the same is to be considered as illustrative and not restrictive in character, it being understood that only illustrative embodiments thereof have been shown and described and that all changes and modifications that come within the spirit of the invention are desired to be protected.

What is claimed is:

1. A method of determining leakage current between a first semiconductor region and a second semiconductor region to be subsequently formed therein, the method comprising the steps of:

correlating surface minority carrier lifetime in the first semiconductor region to leakage current between the first and second semiconductor regions;

based on the correlation between surface minority carrier lifetime and leakage current, establishing a surface minority carrier lifetime threshold;

measuring surface minority carrier lifetime in the first semiconductor region; and determining that the leakage current between the first and second semiconductor regions is acceptable if the measured surface minority carrier lifetime is greater than the surface minority carrier lifetime threshold.

2. The method of claim 1 wherein the first and semiconductor regions form at least a portion of a semiconductor wafer.

3. The method of claim 1 wherein the first semiconductor region is an epitaxial semiconductor region and the second semiconductor region is diffused into the epitaxial semiconductor region.

4. The method of claim 3 wherein the first semiconductor region is an epitaxial semiconductor region and the second semiconductor region is implanted into the epitaxial semiconductor region.

5. The method of claim 1 wherein the first semiconductor region is an N-type semiconductor region and the second semiconductor region is a P-type semiconductor region.

6. The method of claim 1 wherein the first semiconductor region is a P-type semiconductor region and the second semiconductor region is an N-type semiconductor region.

7. The method of claim 2 further including the step of allowing continued fabrication of the semiconductor wafer if the leakage current between the first and second semiconductor regions is acceptable.

8. The method of claim 2 further including the step of scrapping the semiconductor wafer if the measured surface minority carrier lifetime is less than the surface minority carrier lifetime threshold.

9. A method of determining leakage current between a first semiconductor region and a second semiconductor region to be subsequently formed therein, the method comprising the steps of:

establishing a leakage current threshold;

correlating surface minority carrier lifetime in the first semiconductor region to leakage current between the first and second semiconductor regions;

measuring surface minority carrier lifetime in the first semiconductor region;

based on the correlation between surface minority carrier lifetime and leakage current, converting the measured surface minority carrier lifetime to a measured leakage current; and determining that the leakage current between the first and second semiconductor regions is acceptable if the measured leakage current is less than the leakage current threshold.

10. The method of claim 9 wherein the first and semiconductor regions form at least a portion of a semiconductor wafer.

11. The method of claim 9 wherein the first semiconductor region is an epitaxial semiconductor region and the second semiconductor region is diffused into the epitaxial semiconductor region.

12. The method of claim 11 wherein the first semiconductor region is an epitaxial semiconductor region and the second semiconductor region is implanted into the epitaxial semiconductor region.

13. The method of claim 9 wherein the first semiconductor region is an N-type semiconductor region and the second semiconductor region is a P-type semiconductor region.

14. The method of claim 9 wherein the first semiconductor region is a P-type semiconductor region and the second semiconductor region is an N-type semiconductor region.

15. The method of claim 10 further including the step of allowing continued fabrication of the semiconductor wafer if the leakage current between the first and second semiconductor regions is acceptable.

16. The method of claim 10 further including the step of scrapping the semiconductor wafer if the measured leakage current is greater than the leakage current threshold.

* * * * *